United States Patent
Yoon et al.

(10) Patent No.: US 11,973,485 B2
(45) Date of Patent: Apr. 30, 2024

(54) MICROMECHANICAL RESONATOR AND RESONATOR SYSTEM INCLUDING THE SAME

(71) Applicant: SAMSUNG ELECTRONICS CO., LTD., Suwon-si (KR)

(72) Inventors: Yongseop Yoon, Seoul (KR); Sungchan Kang, Hwaseong-si (KR); Cheheung Kim, Yongin-si (KR); Choongho Rhee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 597 days.

(21) Appl. No.: 17/201,576

(22) Filed: Mar. 15, 2021

(65) Prior Publication Data
US 2022/0140802 A1    May 5, 2022

(30) Foreign Application Priority Data

Nov. 3, 2020 (KR) .......................... 10-2020-0145534

(51) Int. Cl.
*H03H 9/02* (2006.01)
(52) U.S. Cl.
CPC .... *H03H 9/02244* (2013.01); *H03H 9/02574* (2013.01); *H03H 2009/02291* (2013.01); *H03H 2009/02496* (2013.01)
(58) Field of Classification Search
CPC .......... H03H 9/02244; H03H 9/02574; H03H 2009/02496
See application file for complete search history.

(56) References Cited

U.S. PATENT DOCUMENTS

| 8,511,163 | B2 | 8/2013 | Mutharasan et al. |
| 10,541,670 | B2 | 1/2020 | Yoon et al. |
| 10,742,190 | B2 | 8/2020 | Yoon et al. |
| 2002/0196103 | A1* | 12/2002 | Yang ...................... H03H 9/173 333/189 |
| 2009/0235746 | A1* | 9/2009 | Mutharasan ..... G01N 33/56911 73/579 |
| 2010/0014140 | A1* | 1/2010 | Akedo ............... G02B 26/0833 359/199.1 |
| 2015/0349237 | A1* | 12/2015 | Aimono ............... H10N 30/802 318/116 |
| 2018/0138886 | A1* | 5/2018 | Yoon .................. H03H 9/02244 |
| 2020/0044624 | A1 | 2/2020 | Kang et al. |

FOREIGN PATENT DOCUMENTS

| KR | 10-2018-0037841 A | 4/2018 |
| KR | 10-2018-0053031 A | 5/2018 |
| KR | 10-2019-0009169 A | 1/2019 |

* cited by examiner

*Primary Examiner* — Bryan P Gordon
(74) *Attorney, Agent, or Firm* — Sughrue Mion, PLLC (57) ABSTRACT

Provided is a micromechanical resonator including a support beam including a first portion supported on a support member and a second portion spaced apart from the first portion in a length direction of the support beam, and a piezoelectric sensing portion provided between the first portion and the second portion and connecting the first portion to the second portion.

20 Claims, 5 Drawing Sheets

MICROMECHANICAL RESONATOR AND RESONATOR SYSTEM INCLUDING THE SAME

CROSS-REFERENCE TO RELATED APPLICATION

This application is based on and claims priority under 35 U.S.C. § 119 to Korean Patent Application No. 10-2020-0145534, filed on Nov. 3, 2020, in the Korean Intellectual Property Office, the disclosure of which is incorporated by reference herein in its entirety.

BACKGROUND

1. Field

Example embodiments of the disclosure relate to a micromechanical resonator and a resonator system including the micromechanical resonator.

2. Description of Related Art

A micromechanical resonator has a structure in which, while one end is fixed, the other end vibrates. The micromechanical resonator may analyze acoustic characteristics or vibration characteristics through the vibration of a cantilever beam structure. The micromechanical resonator may be used for analysis of sound or voice information in mobile electronic devices, automobiles, and the like. Furthermore, the micromechanical resonator may be attached to human skin to measure biometric information such as heart rate and the like, or may be mounted on automobiles or home appliances to measure vibration information. Furthermore, the micromechanical resonator may also be used as an energy harvesting device that generates energy using sound or vibration.

SUMMARY

One or more example embodiments provide a micromechanical resonator having a reduced size.

One or more example embodiments also provide a micromechanical resonator having an improved sensing sensitivity.

Additional aspects will be set forth in part in the description which follows and, in part, will be apparent from the description, or may be learned by practice of embodiments of the disclosure.

In accordance with an aspect of an example embodiment, a micromechanical resonator includes a support member; a support beam including a first portion supported on the support member and a second portion spaced apart from the first portion in a length direction of the support beam; and a piezoelectric sensing portion provided between the first portion and the second portion and connecting the first portion to the second portion.

A geometrical moment of inertia of the piezoelectric sensing portion may be equal to a geometrical moment of inertia of the support beam.

The piezoelectric sensing portion may include a piezoelectric layer, an upper electrode layer located above the piezoelectric layer, and a lower electrode layer located under the piezoelectric layer, and a neutral surface of the piezoelectric sensing portion may be located in the upper electrode layer or the lower electrode layer.

The piezoelectric sensing portion may be asymmetrical with respect to the piezoelectric layer in a thickness direction of the piezoelectric sensing portion.

The piezoelectric sensing portion may include an end portion that is adjacent to the first portion and that is supported on the support member.

The micromechanical resonator may further include a connection portion extending from the piezoelectric sensing portion toward a surface of the second portion to connect the piezoelectric sensing portion to the second portion.

A composition of the connection portion may be equal to a composition of the piezoelectric sensing portion.

The piezoelectric sensing portion may include an end portion that is adjacent to the first portion and that is spaced apart from the support member.

The piezoelectric sensing portion may extend toward a first surface of the first portion.

The micromechanical resonator may further include a connection portion extending from the piezoelectric sensing portion toward a second surface of the second portion to connect the piezoelectric sensing portion to the second portion.

In accordance with an aspect of an example embodiment, a micromechanical resonator includes a support member; and a cantilever including a first portion supported on the support member; a piezoelectric sensing portion including a piezoelectric layer, an upper electrode layer located above the piezoelectric layer, and a lower electrode layer located under the piezoelectric layer, the piezoelectric sensing portion extending from the first portion in a length direction of the cantilever; and a second portion extending from the piezoelectric sensing portion in the length direction.

A geometrical moment of inertia of the piezoelectric sensing portion may be equal to a geometrical moment of inertia of the first portion and a geometrical moment of inertia of the second portion.

A neutral surface of the piezoelectric sensing portion may be located in the upper electrode layer or the lower electrode layer.

The piezoelectric sensing portion may be asymmetrical with respect to the piezoelectric layer in a thickness direction of the piezoelectric sensing portion.

A thickness of the upper electrode layer may be different from a thickness of the lower electrode layer.

The piezoelectric sensing portion may include an end portion that is adjacent to the first portion and that is supported on the support member.

The micromechanical resonator may include a connection portion extending from the piezoelectric sensing portion toward a surface of the second portion to connect the piezoelectric sensing portion to the second portion, wherein a composition of the connection portion is equal to a composition of the piezoelectric sensing portion.

The piezoelectric sensing portion may include an end portion that is adjacent to the first portion and that is spaced apart from the support member, and the piezoelectric sensing portion may extend toward a first surface of the first portion.

The micromechanical resonator may include a connection portion extending from the piezoelectric sensing portion toward a second surface of the second portion to connect the piezoelectric sensing portion to the second portion.

In accordance with an aspect of an example embodiment, a resonator system includes: a frame; and at least one micromechanical resonator supported on the frame, wherein the micromechanical resonator includes: a support member; a support beam comprising a first portion supported on the support member and a second portion spaced apart from the first portion in a length direction of the support beam; and a piezoelectric sensing portion provided between the first portion and the second portion and connecting the first portion to the second portion.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The thickness or size of each layer illustrated in the drawings may be exaggerated for convenience of explanation and clarity. In this regard, embodiments may have different forms and should not be construed as being limited to the descriptions set forth herein. In a layer structure, when a constituent element is disposed "above" or "on" to another constituent element, the constituent element may be directly on the other constituent element or above the other constituent elements in a non-contact manner.

Figure 1:
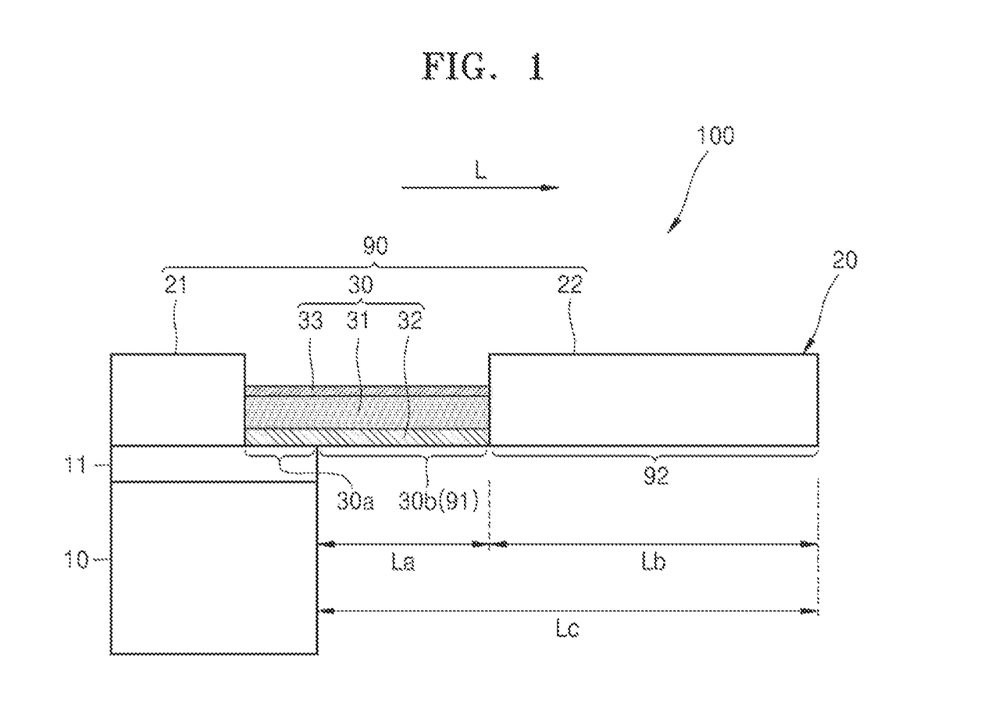
FIG. 1 is a schematic cross-sectional view of a structure of a micromechanical resonator according to an example embodiment.
Figure 2:
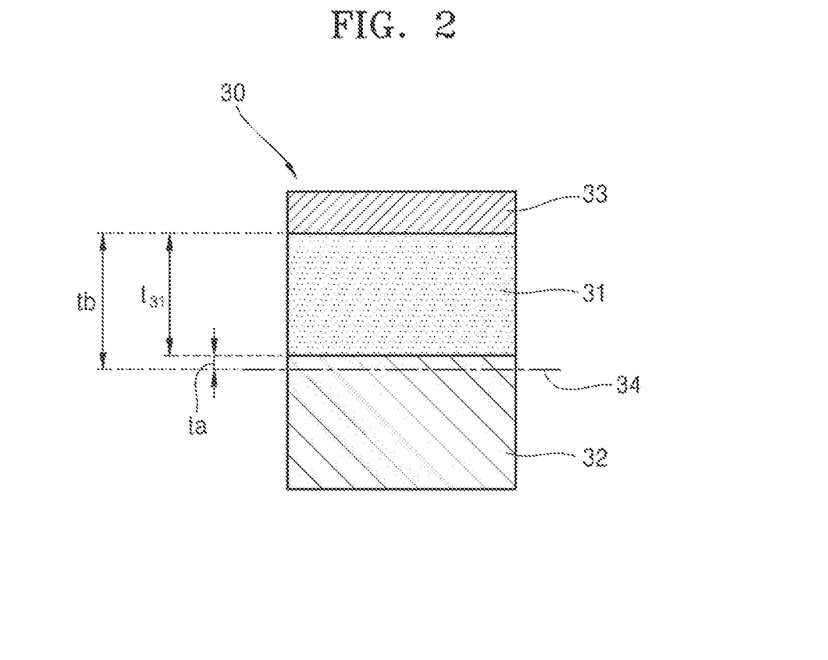
FIG. 2 is a cross-sectional view of a piezoelectric sensing portion according to an example embodiment.
Figure 3:
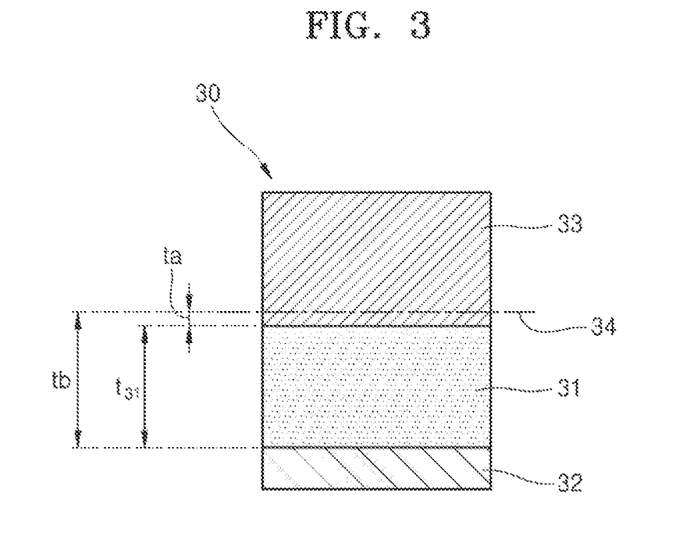
FIG. 3 is a cross-sectional view of a piezoelectric sensing portion according to an example embodiment.

FIG. 1 is a schematic cross-sectional view of a structure of a micromechanical resonator 100 according to an example embodiment. FIG. 2 is a cross-sectional view of a piezoelectric sensing portion 30 according to an example embodiment. FIG. 3 is a cross-sectional view of a piezoelectric sensing portion 30 according to an example embodiment. Referring to FIGS. 1 to 3, the micromechanical resonator 100 may include a support member 10, a support beam 20 including a first portion 21 supported on the support member 10 and a second portion 22 spaced apart from the first portion 21 in a length direction L of the support beam 20, and a piezoelectric sensing portion 30 provided between the first portion 21 and the second portion 22 and connecting the first portion 21 to the second portion 22.

The support member 10 may include, for example, a silicon substrate, a glass substrate, and the like. An insulating layer 11 may be provided on the upper surface of the support member 10, as necessary.

The support beam 20 may be a plate type. For example, the width of the support beam 20 may be about several tens of micrometers to several hundreds of micrometers, and the thickness of the support beam 20 may be less than the width thereof. For example, the thickness of the support beam 20 may be about several micrometers, for example, about 1 μm. The support beam 20 may include, for example, silicon (Si) mainly used in a semiconductor process. The support beam 20 may include glass, silicon oxide, silicon nitride, and the like. The first portion 21 may be supported on the support member 10. The second portion 22 may be spaced apart from the first portion 21 in the length direction L. The width and thickness of the first portion 21 may be the same as the width and thickness of the second portion 22. The first portion 21 and the second portion 22 may be connected to each other by the piezoelectric sensing portion 30.

The piezoelectric sensing portion 30 may include a piezoelectric layer 31, and a lower electrode layer 32 and an upper electrode layer 33 respectively arranged under and above the piezoelectric layer 31. The piezoelectric layer 31 may include a piezoelectric material. The piezoelectric layer 31 may include, for example, AlN, ZnO, SnO, PZT, $ZnSnO_3$, polyvinylidene fluoride (PVDF), poly(vinylidene fluoride-trifluoroethylene) (P(VDF-TrFE)), or PMN-PT. The lower electrode layer 32 and the upper electrode layer 33 may include a conductive metal material such as aluminum, copper, titanium, molybdenum, and the like. In an example, the piezoelectric layer 31 may include aluminum nitride. The piezoelectric layer 31 may be formed by depositing aluminum nitride on the lower electrode layer 32. In this case, in order to improve the crystallinity of aluminum nitride, the lower electrode layer 32 may include molybdenum. The upper electrode layer 33 may include aluminum.

In an example embodiment, the piezoelectric sensing portion 30 is provided between the first portion 21 and the second portion 22, and connects the first portion 21 to the second portion 22. An end portion region 30a (i.e., an end portion) of the piezoelectric sensing portion 30 adjacent to the first portion 21 of the support beam 20 may be supported on the support member 10. The support beam 20 and the piezoelectric sensing portion 30 as a whole form a cantilever 90 having one end portion that is a fixed end supported on the support member 10 and the other end that is a free end vibrated by an external force. In other words, the cantilever 90 may include the first portion 21 supported on the support member 10, the piezoelectric sensing portion 30 including the piezoelectric layer 31 and the upper electrode layer 33 and the lower electrode layer 32 respectively located above and under the piezoelectric layer 31, and extending from the first portion 21 in the length direction L as shown in FIG. 1, and the second portion 22 extending from the piezoelectric sensing portion 30 in the length direction L.

An effective sensing region of the piezoelectric sensing portion 30 may be a portion 30b of the piezoelectric sensing portion 30 that is not supported on the support member 10. The end portion 30a may not be included in the effective sensing region of the piezoelectric sensing portion 30. In terms of the cantilever 90, the portion 30b of the piezoelectric sensing portion 30 is a sensing portion 91 that senses an external force, and the second portion 22 is a non-sensing portion 92 that does not sense an external force.

When an external force, for example, vibration, sound, pressure, and the like is applied to the cantilever 90, a bending moment is applied to the cantilever 90. When the resonant frequency of the cantilever 90 and the frequency of an external force are matched with each other, a resonance phenomenon may be generated, and in this case, a bending moment may be increased. The bending moment causes stress to each layer of the piezoelectric sensing portion 30 forming the cantilever 90. Electric charges in an amount proportional to the stress may be generated in the piezoelectric layer 31. The stress may be tensile stress or compression stress. Charge quantity Q generated in the piezoelectric layer 31 may be expressed by Equation (1) below.

$$Q = \frac{d_{31}PW^2E_{31}(t_b^2 - t_a^2)\left(\frac{1}{3}L_a^3 - L_cL_a^2 + L_c^2L_a\right)}{4t_{31}(EI_{zz})_{overall}}$$

Equation (1)

Here, $d_{31}$ denotes the piezoelectric constant of the piezoelectric layer 31, P denotes an external pressure, W denotes the width of the piezoelectric layer 31, and $E_{31}$ denotes the Young's modulus of the piezoelectric layer 31. $t_a$ denotes a distance from a neutral surface 34 (see, e.g., FIGS. 2 and 3) to a surface of the piezoelectric layer 31 that is closer to the neutral surface 34 (a lower surface of the piezoelectric layer 31 in FIG. 2, and an upper surface of the piezoelectric layer 31 in FIG. 3). $t_b$ denotes a distance from the neutral surface 34 to a surface of the piezoelectric layer 31 that is farther from the neutral surface 34 (the upper surface of the piezoelectric layer 31 in FIG. 2, and the lower surface of the piezoelectric layer 31 in FIG. 3). The neutral surface 34 is a surface where stress becomes '0' when a bending moment is applied to the piezoelectric sensing portion 30. La denotes the length of the sensing portion 91. Lc denotes the length from the support member 10 to the free end of the cantilever 90. $t_{31}$ denotes a thickness of the piezoelectric layer 31. $(EI_{zz})_{overall}$ denotes the flexural stiffness of the sensing portion 91. For example, when the Young's modulus and the geometrical moment of inertia of the piezoelectric layer 31 respectively are $E_{31}$ and $I_{31}$, the Young's modulus and the geometrical moment of inertia of the lower electrode layer 32 respectively are $E_{32}$ and $I_{32}$, and the Young's modulus and the geometrical moment of inertia of the upper electrode layer 33 respectively are $E_{33}$ and $I_{33}$, $(EI_{zz})_{overall} = E_{31}I_{31} + E_{32}I_{32} + E_{33}I_{33}$ in the example illustrated in FIG. 1.

A voltage V that is proportional to the charge quantity Q and inversely proportional to the capacitance C of the piezoelectric layer 31 is generated in the upper electrode layer 33 and the lower electrode layer 32 formed above/under the piezoelectric layer 31 by the electric charge generated in the piezoelectric layer 31. When the permittivity of the piezoelectric layer 31 is ε, the capacitance C of the piezoelectric layer 31 may be expressed by Equation (2) below.

$$C = \frac{WL_a}{\varepsilon}$$

Equation (2)

From Equations (1) and (2), the voltage V may be expressed by Equation (3) below.

$$V = \frac{Q}{C} = \frac{d_{31}PWE_{31}(t_b^2 - t_a^2)\left(\frac{1}{3}L_a^2 - L_cL_a + L_c^2\right)}{4\varepsilon(EI_{zz})_{overall}}$$

Equation (3)

Consequently, in the micromechanical resonator 100 according to an example embodiment, information about the external force such as vibration, sound, pressure, and the like may be obtained by detecting and interpreting the voltage V generated in the piezoelectric sensing portion 30 due to the external force such as vibration, sound, pressure, and the like.

Figure 4:
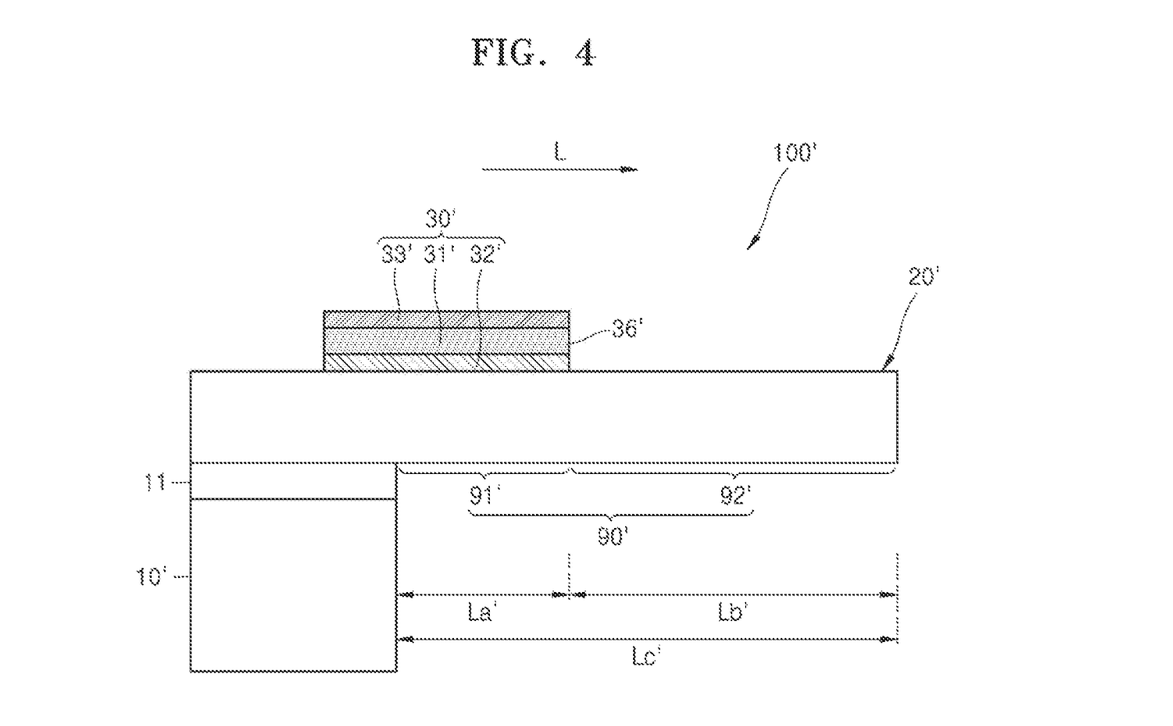
FIG. 4 is a cross-sectional view of a micromechanical resonator according to a comparative example.

FIG. 4 is a cross-sectional view of a micromechanical resonator 100' according to a comparative example. Referring to FIG. 4, the micromechanical resonator 100' according to a comparative example may include a support beam 20' supported on a support member 10', and a piezoelectric sensing portion 30' formed on an upper surface of the support beam 20'. The piezoelectric sensing portion 30' may include a lower electrode layer 32', a piezoelectric layer 31', and an upper electrode layer 33', which are sequentially stacked from the upper surface of the support beam 20'. La' denotes the length of a sensing portion 91', and Lc' denotes the length from the support member 10' to a free end of the support beam 20'. Lb' is the length of a portion of the support beam 20' where the piezoelectric sensing portion 30' is not formed, that is, the length of a non-sensing portion 92'.

The effect of the micromechanical resonator 100 according to an example embodiment is described by comparison with the micromechanical resonator 100' of the comparative example of FIG. 4.

Referring to Equations (1) and (3), as the flexural stiffness $(EI_{zz})_{overall}$ of the sensing portion decreases, the charge quantity Q and the voltage V increase. According to the example embodiment of FIG. 1, only the piezoelectric sensing portion 30 exists in the sensing portion 91, and the support beam 20 does not exist therein. Accordingly, when the Young's modulus and the geometrical moment of inertia of the piezoelectric layer 31 respectively are $E_{31}$ and $I_{31}$, the Young's modulus and the geometrical moment of inertia of the lower electrode layer 32 respectively are $E_{32}$ and $I_{32}$, and the Young's modulus and the geometrical moment of inertia of the upper electrode layer 33 respectively are $E_{33}$ and $I_{33}$, the flexural stiffness $(EI_{zz})_{overall}$ of the sensing portion 91 is $E_{31}I_{31} + E_{32}I_{32} + E_{33}I_{33}$. In contrast, according to the comparative example of FIG. 4, the sensing portion 91' is in the form of the piezoelectric sensing portion 30' being stacked on the upper surface of the support beam 20'. When the flexural stiffness of the piezoelectric sensing portion 30' is the same as the flexural stiffness of the piezoelectric sensing portion 30, the flexural stiffness $(EI_{zz})_{overall'}$ of the sensing portion 91' is $E_{31}I_{31} + E_{32}I_{32} + E_{33}I_{33} + E_{44}I_{44}$. $E_{44}I_{44}$ is the flexural stiffness of the support beam 20'. As $(EI_{zz})_{overall'} = (EI_{zz})_{overall} + E_{44}I_{44}$, according to the micromechanical resonator 100, the flexural stiffness $(EI_{zz})_{overall}$ of the sensing portion 91 may be decreased, and thus a high output, that is, a high voltage V, may be obtained, compared with the micromechanical resonator 100' of the comparative example.

Next, referring back to Equations (1) and (3), as $(t_b^2 - t_a^2)$ increases, the charge quantity Q and the voltage V generated in the piezoelectric sensing portion 30 increase. To this end, as illustrated in FIGS. 2 and 3, the neutral surface 34 is located in a layer other than the piezoelectric layer 31. For example, the neutral surface 34 may be located in the lower electrode layer 32 or the upper electrode layer 33. In an example, the piezoelectric sensing portion 30 may be asymmetric with respect to the piezoelectric layer 31 in a thickness direction of the piezoelectric sensing portion 30. In an example, the thickness of the lower electrode layer 32 and the thickness of the upper electrode layer 33 may be different from each other. The material and thickness of the lower electrode layer 32 and the material and thickness of the upper electrode layer 33 may be determined such that the neutral surface 34 is located in the lower electrode layer 32 or the upper electrode layer 33. For example, in the example embodiment of FIG. 2, the upper electrode layer 33 may include a material having a flexural stiffness less than that of the lower electrode layer 32, and the thickness of the upper electrode layer 33 may be less than the thickness of the lower electrode layer 32. For example, the lower electrode layer 32 may include molybdenum, and the upper electrode layer 33 may include a material having a relatively small flexural stiffness such as aluminum, copper, titanium, and the like. For example, in the example embodiment of FIG. 3, the lower electrode layer 32 may include a material having a flexural stiffness less than that of the upper electrode layer 33, and the thickness of the lower electrode layer 32 may be less than the thickness of the upper electrode layer 33. According to the above configuration, a quite high output, that is, a quite high voltage V, may be obtained, compared with the micromechanical resonator 100' of the comparative example.

Next, the resonant frequency of the cantilever may be proportional to the length of a cantilever capable of resonating. According to the micromechanical resonator 100' of the comparative example, as the piezoelectric sensing portion 30' is supported on the upper surface of the support beam 20', the flexural stiffness $(EI_{zz})_{all'}$ of the sensing portion 91' is so large that a portion of the sensing portion 91' corresponding to the length La' is difficult to function as an effective resonance portion. In other words, according to the micromechanical resonator 100' of the comparative example, the non-sensing portion 92' is a substantially effective resonance portion, and thus the length of a cantilever 90' capable of resonating is Lb'. In this regard, according to the micromechanical resonator 100, the sensing portion 91 and the second portion 22 of the support beam 20, that is, the non-sensing portion 92, are all effective resonance portions, and the length of the effective resonance portion is the total length Lc of the cantilever 90. In other words, for the same resonant frequency, the total length Lc of the cantilever 90 is less than the total length Lc' of the cantilever 90' of the comparative example. Accordingly, the micromechanical resonator 100 may be miniaturized, compared with the micromechanical resonator 100' of the comparative example.

The geometrical moment of inertia of the piezoelectric sensing portion 30 may be the same as the geometrical moment of inertia of the support beam 20. When the Young's modulus and the geometrical moment of inertia of the piezoelectric layer 31 respectively are $E_{31}$ and $I_{31}$, the Young's modulus and the geometrical moment of inertia of the lower electrode layer 32 respectively are $E_{32}$ and $I_{32}$, and the Young's modulus and the geometrical moment of inertia of the upper electrode layer 33 respectively are $E_{33}$ and $I_{33}$, in the example embodiment of FIG. 1, a geometrical moment of inertia $(EI)_{30}$ of the piezoelectric sensing portion 30 may be $E_{31}I_{31}+E_{32}I_{32}+E_{33}I_{33}$. When the geometrical moment of inertia of the support beam 20 is $(EI)_{20}$, the materials and thicknesses of the piezoelectric layer 31, the lower electrode layer 32, and the upper electrode layer 33 may be determined such that $(EI)_{30}=(EI)_{20}$. According to the above configuration, as the geometrical moment of inertia of the cantilever 90 is uniform in the length direction L, a stable resonance behavior of the cantilever 90 is possible. The materials and thicknesses of the piezoelectric layer 31, the lower electrode layer 32, and the upper electrode layer 33 may be determined such that the neutral surface 34 is located in the lower electrode layer 32 or the upper electrode layer 33.

For each of the micromechanical resonator 100' of the comparative example and the micromechanical resonator 100, results of a calculation of the length of a cantilever, the flexural stiffness ratio of a sensing portion, a ratio of $(t_b^2-t_a^2)$, and a voltage ratio are shown in Table 1. Each value is calculated for the respective resonant frequencies of 2 kHz, 1 kHz, and 300 Hz. The flexural stiffness ratio, the ratio of $(t_b^2-t_a^2)$, and the voltage ratio of the sensing portion 91 are respectively the ratios of the value corresponding to the micromechanical resonator 100 to the value corresponding to the micromechanical resonator 100'. The basic data of the calculation are as follows.

[Basic Data of the Micromechanical Resonator 100' of the Comparative Example]
Support beam 20': Si (thickness 1.5 μm)
Piezoelectric layer 31': aluminum nitride (AlN, thickness 0.2 μm)
Lower electrode layer 32': molybdenum (thickness 0.15 μm)
Upper electrode layer 33': molybdenum (thickness 0.1 μm)
Length of sensing portion 91': 300 μm
Location of neutral surface: support beam 20'

[Basic Data of the Micromechanical Resonator 100 of the Present Example Embodiment]
Support beam 20: Si (thickness 1.5 μm)
Piezoelectric layer 31: aluminum nitride (AlN, thickness 0.5 μm)
Lower electrode layer 32: molybdenum (thickness 0.59 μm)
Upper electrode layer 33: aluminum (thickness 0.1 μm)
Length of sensing portion 91: 300 μm
Location of neutral surface: lower electrode layer 32

TABLE 1

| | Comparative Example | Example embodiment |
|---|---|---|
| Resonant Frequency (kHz) | 2.0/1.0/0.30 | 2.03/1.02/0.30 |
| Total Length of Cantilever | 1160/1579/2690 | 870/1250/2380 |
| Flexural Stiffness Ratio of Sensing portion | 1 | 0.3 |
| Ratio of $(t_b^2 - t_a^2)$ | 1 | 1.2 |
| Voltage Ratio | 1/1/1 | 2.0/2.3/3.0 |

Figure 5:
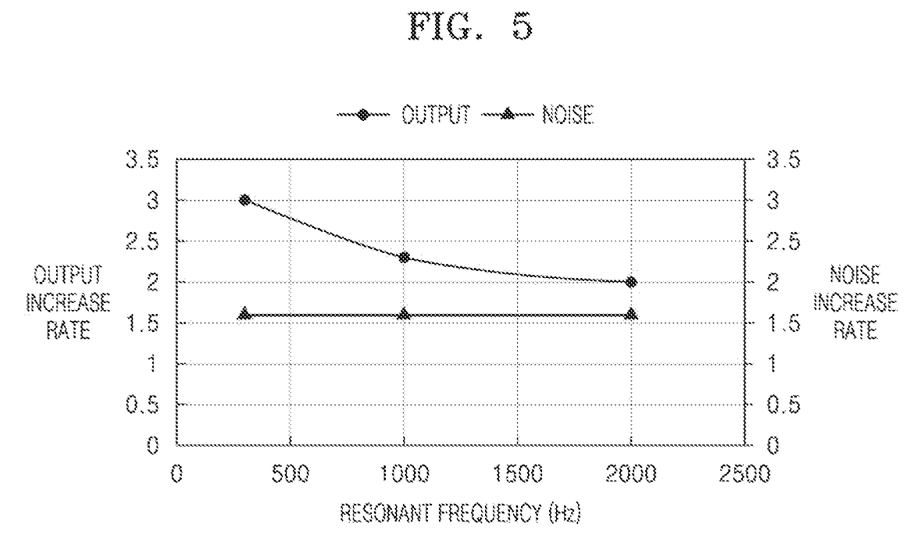
FIG. 5 is a graph of an output increase rate and a noise increase rate of the micromechanical resonator of the example embodiment of FIG. 1 with respect to a micromechanical resonator of the comparative example of FIG. 4.

Referring to Table 1, compared with the micromechanical resonator 100' of the comparative example, the output voltage of the micromechanical resonator 100 of the present example embodiment is relatively high about 2 times, 2.3 times, and 3 times respectively at the resonant frequencies of 2 kHz, 1 kHz, and 300 Hz. In other words, the voltage ratios are about 2.0/1, 2.3/1, and 3.0/1 for each of the respective resonant frequencies. FIG. 5 is a graph of output increase rates and noise increase rates of the micromechanical resonator 100 with respect to the micromechanical resonator 100' of the comparative example. Referring to FIG. 5, the noise increase rate is about 1.6. This is because the thickness of the piezoelectric layer 31 is greater than the thickness of the piezoelectric layer 31' by about 2.5 times. In detail, the capacitance is inversely proportional to the thickness of a piezoelectric layer. Accordingly, when the thickness of a piezoelectric layer is increased about 2.5 times, the capacitance is increased about 1/2.5 times. Thermal noise is inversely proportional to the square root of the capacitance C as can be seen from Equation (4) below. In Equation (4), T denotes a temperature, and κ denotes a Boltzmann constant. Consequently, thermal noise is proportional to the square root of the thickness of a piezoelectric layer. Accordingly, when the thickness of a piezoelectric layer is increased about 2.5 times, thermal noise is increased about 1.6 times.

$$\text{Thermal Noise} = \sqrt{\frac{\kappa T}{C}} \quad \text{Equation (4)}$$

Considering the increase of thermal noise, a signal to noise ratio (SNR: signal to noise=output increase rate/noise increase rate) is 2/1.6=1.25 at 2 kHz, and 3/1.6=about 1.9 at 300 Hz so that the micromechanical resonator 100 having high sensing sensitivity may be implemented. Simultaneously, the length of the cantilever 90 of the micromechanical resonator 100 may be decreased about 25%, 21%, and 12% respectively at 2 kHz, 1 kHz, and 300 Hz, compared with the cantilever 90' of the micromechanical resonator 100' of the comparative example. Accordingly, the micromechanical resonator 100 may be implemented as a compact micromechanical resonator having high output and sensing sensitivity. When the signal to noise ratio increases, for example, very small sound may be sensed so that remote distance voice recognition performance may be improved. Furthermore, the decrease in the length of the cantilever 90 causes a decrease in the size of the micromechanical resonator 100 so that the manufacturing cost of the micromechanical resonator 100 may be reduced.

Figure 6:
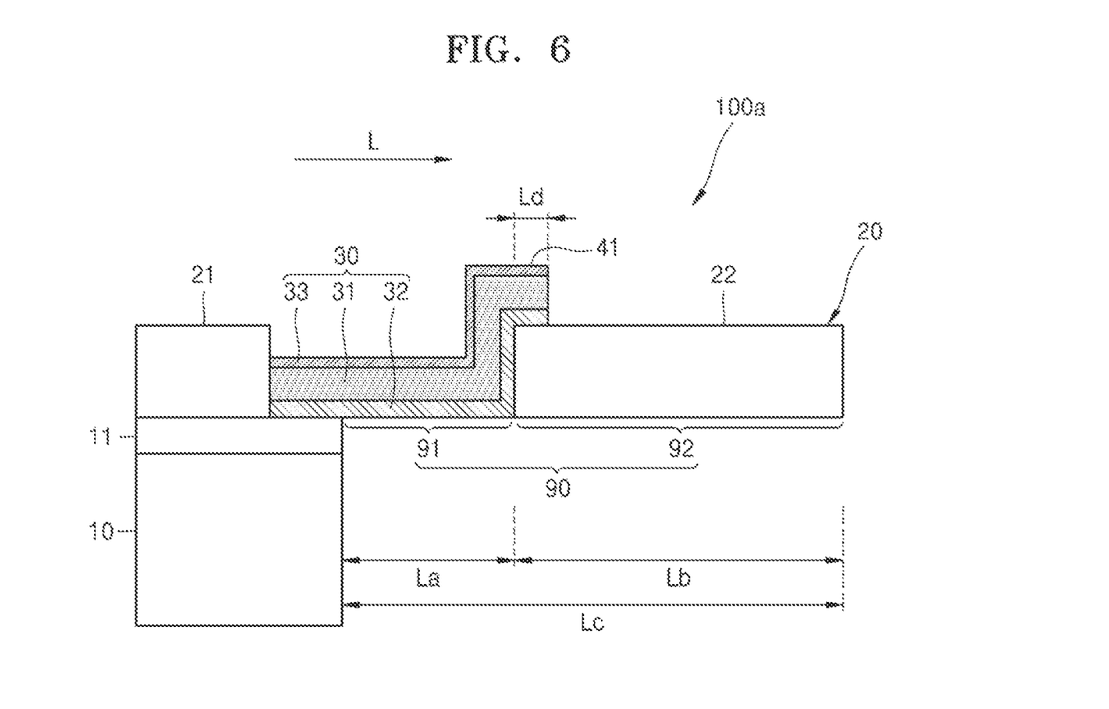
FIG. 6 is a schematic cross-sectional view of a micromechanical resonator according to an example embodiment.

FIG. 6 is a schematic cross-sectional view of a micromechanical resonator 100a according to an example embodiment. Referring to FIG. 6, the micromechanical resonator 100a is different from the micromechanical resonator 100 of FIG. 1 in that the former includes a connection portion 41 that connects the piezoelectric sensing portion 30 to the second portion 22 of the support beam 20. In the following description, differences are mainly discussed. The connection portion 41 extends from an end portion adjacent to the second portion 22 of the piezoelectric sensing portion 30 to a surface of the second portion 22, for example, an upper surface of the second portion 22. Accordingly, the piezoelectric sensing portion 30 and the second portion 22 are firmly connected by the connection portion 41. Accordingly, the cantilever 90 including the piezoelectric sensing portion 30 and the second portion 22 may perform a stable resonance behavior, and thus operational reliability of the micromechanical resonator 100a may be improved. A length Ld of the connection portion 41 that extends across the surface of the second portion 22 may be reduced as long as the piezoelectric sensing portion 30 is firmly connected to the second portion 22.

As a material of the connection portion 41, any material capable of connecting the piezoelectric sensing portion 30 to the second portion 22 of the support beam 20 may be employed. In an example, the composition of the connection portion 41 may be the same as (i.e., equal to) the composition of the piezoelectric sensing portion 30. According to the above configuration, as the connection portion 41 may be simultaneously formed when the piezoelectric sensing portion 30 is formed, the manufacturing process cost of the micromechanical resonator 100a may be reduced.

Figure 7:
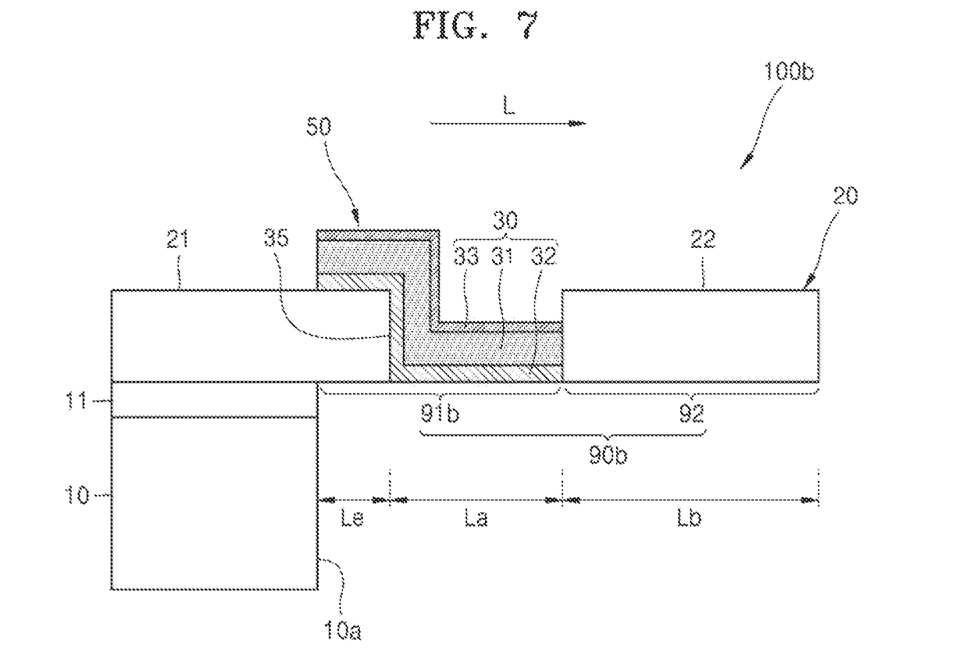
FIG. 7 is a schematic cross-sectional view of a micromechanical resonator according to an example embodiment.

FIG. 7 is a schematic cross-sectional view of a micromechanical resonator 100b according to an example embodiment. Referring to FIG. 7, the micromechanical resonator 100b is different from the micromechanical resonator 100 of FIG. 1 in that an end portion 35 of the piezoelectric sensing portion 30, which is adjacent to the first portion 21, is spaced apart from the support member 10. In other words, the first portion 21 of the support beam 20 extends beyond an end portion 10a of the support member 10 in the length direction L. Accordingly, the end portion 35 of the piezoelectric sensing portion 30, which is adjacent to the first portion 21, is spaced apart from the support member 10 in the length direction L. The piezoelectric sensing portion 30 extends toward a surface (i.e., a first surface), for example, an upper surface, of the first portion 21. The piezoelectric sensing portion 30 and the first portion 21 of the support beam 20 may be firmly connected to each other by an extension portion of the piezoelectric sensing portion 30, that is, an extension portion 50. Accordingly, a stable resonance behavior of a cantilever 90b is possible, and operation reliability of the micromechanical resonator 100b may be improved.

The composition of the extension portion 50 may be the same as the composition of the piezoelectric sensing portion 30. Accordingly, in the micromechanical resonator 100b, the length of a sensing portion 91b may be increased by a length Le, compared with the micromechanical resonator 100. In other words, the length of the sensing portion 91b may be (La+Le). The capacitance C of the sensing portion 91b is proportional to the length of the sensing portion 91b. As can be seen from Equation (4), thermal noise is inversely proportional to the square root of the capacitance C. Thus, thermal noise may be reduced by increasing the length of the sensing portion 91b, and thus the micromechanical resonator 100b having an improved sensing sensitivity may be implemented. Furthermore, as the extension portion 50 may be simultaneously formed in a process of manufacturing the piezoelectric sensing portion 30, the extension portion 50 may be formed without increasing the manufacturing process cost.

Figure 8:
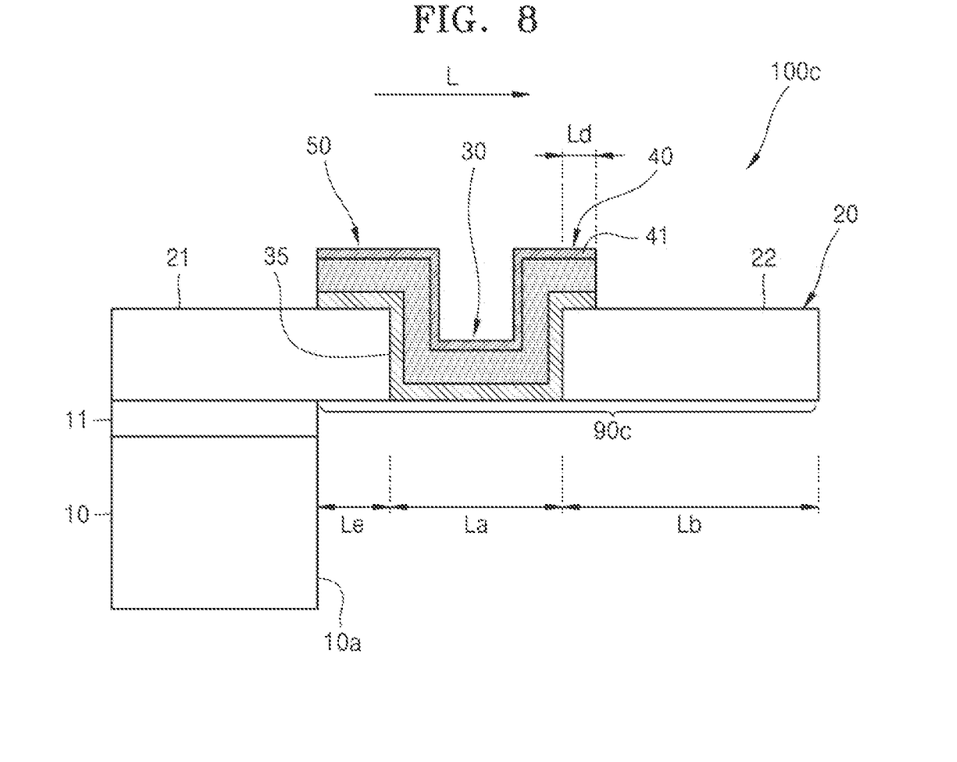
FIG. 8 is a schematic cross-sectional view of a micromechanical resonator according to an example embodiment.

FIG. 8 is a schematic cross-sectional view of a micromechanical resonator 100c according to an example embodiment. Referring to FIG. 8, the micromechanical resonator 100c is different from the micromechanical resonator 100b of FIG. 7 in that the former includes the connection portion 41 that connects the piezoelectric sensing portion 30 to the second portion 22 of the support beam 20 as described above with reference, e.g., to FIG. 6. The connection portion 41 extends from an end portion adjacent to the second portion 22 of the piezoelectric sensing portion 30 toward the surface (i.e., second surface) of the second portion 22, for example, the upper surface of the second portion 22. Accordingly, the piezoelectric sensing portion 30 and the second portion 22 are firmly connected to each other by the connection portion 41. Accordingly, a stable resonance behavior of a cantilever 90c is possible, and operation reliability of the micromechanical resonator 100c may be improved. The length Ld of the connection portion 41 that extends across the surface of the second portion 22 may be reduced as long as the piezoelectric sensing portion 30 is firmly connected to the second portion 22. Accordingly, an increase of flexural stiffness of the cantilever 90c may be reduced. As a material of the connection portion 41, any material capable of connecting the piezoelectric sensing portion 30 to the second portion 22 of the support beam 20 may be employed. In an example, the composition of the connection portion 41 may be the same as the composition of the piezoelectric sensing portion 30. According to the above configuration, as the connection portion 41 may be simultaneously formed when the piezoelectric sensing portion 30 is formed, the manufacturing process cost of the micromechanical resonator 100c may be reduced.

Figure 9:
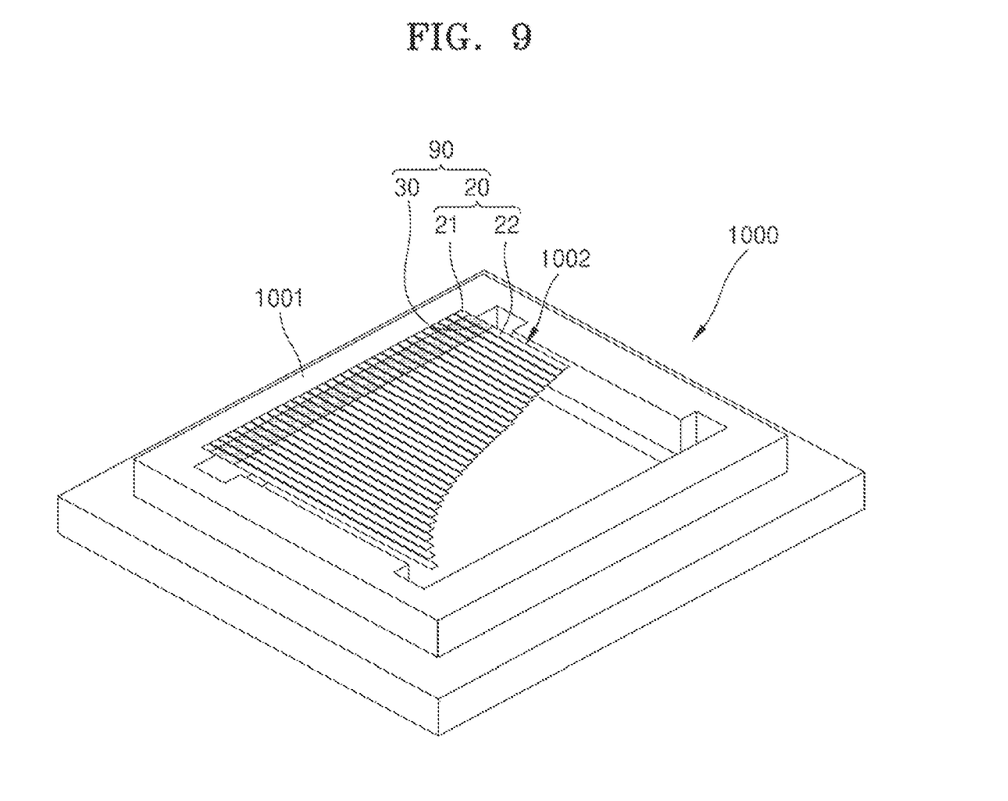
FIG. 9 is a perspective view of a resonator system according to an example embodiment.

FIG. 9 is a perspective view of a resonator system 1000 according to an example embodiment. Referring to FIG. 9, the resonator system 1000 may include a frame 1001 and a plurality of micromechanical resonators 1002 supported on the frame 1001. At least one micromechanical resonator of the micromechanical resonators 1002 may have a structure illustrated in any one or more of FIGS. 1 to 3 and 6 to 8. The support member 10 may be implemented by the frame 1001. The micromechanical resonators 1002 may have resonant frequencies different from each other. To this end, the lengths of the micromechanical resonators 1002 may be different from each other. According to the above configuration, the micromechanical resonators 1002 resonate by external forces having different frequencies. The resonator system 1000 may function as, for example, a sound spectrum analyzer. A micromechanical resonator having a reduced size may be implemented by decreasing the length of the support beam. Furthermore, a micromechanical resonator having an improved sensing sensitivity may be implemented by increasing the output voltage of a piezoelectric sensing portion.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A micromechanical resonator comprising:
a support member;
a support beam comprising a first portion supported on the support member and a second portion spaced apart from the first portion in a length direction of the support beam; and
a piezoelectric sensing portion comprising a piezoelectric layer provided between the first portion and the second portion and connecting the first portion to the second portion.

2. The micromechanical resonator of claim 1, wherein a geometrical moment of inertia of the piezoelectric sensing portion is equal to a geometrical moment of inertia of the support beam.

3. The micromechanical resonator of claim 2, wherein the piezoelectric sensing portion further comprises:
an upper electrode layer located above the piezoelectric layer; and
a lower electrode layer located under the piezoelectric layer, and
wherein a neutral surface of the piezoelectric sensing portion is located in the upper electrode layer or the lower electrode layer.

4. The micromechanical resonator of claim 3, wherein the piezoelectric sensing portion is asymmetrical with respect to the piezoelectric layer in a thickness direction of the piezoelectric sensing portion.

5. The micromechanical resonator of claim 3, wherein the piezoelectric sensing portion comprises an end portion that is adjacent to the first portion and that is supported on the support member.

6. The micromechanical resonator of claim 5, further comprising a connection portion extending from the piezoelectric sensing portion toward a surface of the second portion to connect the piezoelectric sensing portion to the second portion.

7. The micromechanical resonator of claim 6, wherein a composition of the connection portion is equal to a composition of the piezoelectric sensing portion.

8. The micromechanical resonator of claim 3, wherein the piezoelectric sensing portion comprises an end portion that is adjacent to the first portion and that is spaced apart from the support member.

9. The micromechanical resonator of claim 8, wherein the piezoelectric sensing portion extends toward a first surface of the first portion.

10. The micromechanical resonator of claim 8, further comprising a connection portion extending from the piezoelectric sensing portion toward a second surface of the second portion to connect the piezoelectric sensing portion to the second portion.

11. A micromechanical resonator comprising:
a support member; and
a cantilever comprising:
a first portion supported on the support member;
a piezoelectric sensing portion comprising a piezoelectric layer, an upper electrode layer located above the piezoelectric layer, and a lower electrode layer located under the piezoelectric layer, the piezoelectric sensing portion extending from the first portion in a length direction of the cantilever; and
a second portion extending from the piezoelectric sensing portion in the length direction,
wherein the piezoelectric layer is between the first portion and the second portion.

12. The micromechanical resonator of claim 11, wherein a geometrical moment of inertia of the piezoelectric sensing portion is equal to a geometrical moment of inertia of the first portion and a geometrical moment of inertia of the second portion.

13. The micromechanical resonator of claim 11, wherein a neutral surface of the piezoelectric sensing portion is located in the upper electrode layer or the lower electrode layer.

14. The micromechanical resonator of claim 11, wherein the piezoelectric sensing portion is asymmetrical with respect to the piezoelectric layer in a thickness direction of the piezoelectric sensing portion.

15. The micromechanical resonator of claim 11, wherein a thickness of the upper electrode layer is different from a thickness of the lower electrode layer.

16. The micromechanical resonator of claim 11, wherein the piezoelectric sensing portion comprises an end portion that is adjacent to the first portion and that is supported on the support member.

17. The micromechanical resonator of claim 16, further comprising a connection portion extending from the piezoelectric sensing portion toward a surface of the second portion to connect the piezoelectric sensing portion to the second portion,
wherein a composition of the connection portion is equal to a composition of the piezoelectric sensing portion.

18. The micromechanical resonator of claim 11, wherein the piezoelectric sensing portion comprises an end portion that is adjacent to the first portion and is spaced apart from the support member, and
wherein the piezoelectric sensing portion extends toward a surface of the first portion.

19. The micromechanical resonator of claim 18, further comprising a connection portion extending from the piezoelectric sensing portion toward a surface of the second portion to connect the piezoelectric sensing portion to the second portion.

20. A resonator system comprising:
a frame; and
at least one micromechanical resonator supported on the frame,
wherein the at least one micromechanical resonator comprises:
a support member;
a support beam comprising a first portion supported on the support member and a second portion spaced apart from the first portion in a length direction of the support beam; and
a piezoelectric sensing portion comprising a piezoelectric layer provided between the first portion and the second portion and connecting the first portion to the second portion.

* * * * *